United States Patent
Ang

(10) Patent No.: US 6,380,806 B1
(45) Date of Patent: Apr. 30, 2002

(54) DIFFERENTIAL TELESCOPIC OPERATIONAL AMPLIFIER HAVING SWITCHED CAPACITOR COMMON MODE FEEDBACK CIRCUIT PORTION

(75) Inventor: Boon-Aik Ang, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 45 days.

(21) Appl. No.: 09/653,670

(22) Filed: Sep. 1, 2000

(51) Int. Cl.$^7$ ................................................. H03F 3/45
(52) U.S. Cl. ...................................... 330/258; 330/259
(58) Field of Search ............................ 330/9, 253, 257, 330/258, 259, 261; 341/161

(56) References Cited

U.S. PATENT DOCUMENTS

| | | | | |
|---|---|---|---|---|
| 4,906,943 A | * | 3/1990 | Koch | 330/258 |
| 4,992,755 A | * | 2/1991 | Seevinck et al. | 330/259 X |
| 4,994,808 A | | 2/1991 | Wichelman | 341/161 |
| 5,465,093 A | | 11/1995 | Kusumoto et al. | 341/122 |
| 5,534,864 A | | 7/1996 | Ono et al. | 341/156 |
| 5,541,602 A | | 7/1996 | Opris et al. | 341/161 |
| 5,572,212 A | | 11/1996 | Levinson et al. | 341/162 |
| 5,635,937 A | | 6/1997 | Lim et al. | 341/161 |
| 5,710,563 A | | 1/1998 | Vu et al. | 341/161 |
| 5,861,832 A | | 1/1999 | Nagaraj | 341/161 |
| 5,874,912 A | | 2/1999 | Hasegawa | 341/161 |

OTHER PUBLICATIONS

A Pipelined 5–Msample/s 9–bit Analog–to–Digital Converter; Lewis, et al., IEEE Journal of Solid–State Circuits, vol. sc–22, No. 6, Dec. 1987.

A 13–b 2.5–MHz Self–Calibrated Pipelined A/D Converter in 3–$\mu$m CMOS; Lin, et al., IEEE Journal of Solid–State Circuits, vol. 26, No. 4, Apr. 1991.

A 10–b 20–Msample/s Analog–to–Digital Converter; Lewis, et al., IEEE Journal of Solid–State Circuits, vol. 27, No. 3, Mar. 1992.

A 10 b, 20 Msample/s, 35 mW Pipeline A/D Converter; Byunghak, et al.; IEEE Journal of Solid–State Circuits, vol. 30, No. 3, Mar. 1995.

A 250–mW, 8–b, 52–Msample/s Parallel–Pipelined A/D Converter with Reduced Number of Amplifiers; Nagaraj, et al.; IEEE Journal of Solid–State Circuits, vol. 32, No. 3, Mar. 1997.

A High–Swing CMOS Telescopic Operational Amplifier; Gulati, et al., IEEE Journal of Solid–State Circuits, vol. 33, No. 12, Dec. 1998.

* cited by examiner

Primary Examiner—Steven J. Mottola
(74) Attorney, Agent, or Firm—Renner, Otto, Boisselle & Sklar, LLP

(57) ABSTRACT

The present invention provides a fully differential telescopic operational amplifier having a switch capacitor common mode feedback (CMFB) circuit portion. The switched capacitor CMFB circuit portion has a current mirror for mirroring current from a first transistor to a second transistor. The first and second transistors have gates which are coupled via a transmission gate switch. Drains of each of the first and second transistors are respectively coupled to a first and a second differential pair of transistors, each differential pair connected to receive a common mode voltage and drains of the first differential pair connected to the gate of the first transistor. The first and second differential pair are scaled with respect to each other such that the gate to source voltage of the first transistor is substantially equal to the gate to source voltage of the second transistor.

6 Claims, 5 Drawing Sheets

DIFFERENTIAL TELESCOPIC OPERATIONAL AMPLIFIER HAVING SWITCHED CAPACITOR COMMON MODE FEEDBACK CIRCUIT PORTION

TECHNICAL FIELD

The present invention generally relates to operational amplifiers and, more particularly, to a switch capacitor common mode feedback (CMFB) circuit portion for a fully differential telescopic operational amplifier for reducing systematic current mirror error, the operational amplifier being particularly suited for use as a sample and hold stage or a residue amplifier stage in a high resolution pipeline analog to digital converter.

BACKGROUND ART

FIG. 1 illustrates a traditional switched capacitor common mode feedback (CMFB) circuit portion 10 for a differential telescopic operational amplifier. The operational amplifier has an input differential pair made up of MOSFETs M3 and M4 having gates respectively connected to input nodes In+ and In−, where In+ and In− are the non-inverting and inverting inputs of the operational amplifier. MOSFET M1 is connected to mirror current to M2 such that bias current I3 is approximately equal to the sum of bias currents I1 and I2. The current mirroring uses a switched current technique via switch 12a. Switch 12a is implemented with CMOS transmission gates enabled by a non-overlapping clock signal. In the context of a sample and hold amplifier, the clock signal defines a sample period and a hold period. More specifically, during the sample period, switches 12a, 12b and 12c close and capacitors $C_{CMFB+}$ and $C_{CMFB-}$ are charged to a voltage approximately equal to the output common mode voltage during the sample period ($V_{OCM,\ sample}$) minus the gate to source voltage of the pair M1 and M2 ($V_{GS,M1/M2}$). During the hold period, switches 12a, 12b and 12c open and M2 along with the capacitors $C_{CMFB+}$ and $C_{CMFB-}$ form a common mode feedback loop for the telescopic amplifier.

The traditional switched capacitor CMFB portion 10, however, suffers from the introduction of error in current mirroring (i.e., $I_{error}$) such that the bias current I3 plus $I_{error}$ no longer is approximately equal to I1 plus I2. For no systematic current mirroring error due to channel length modulation, the drain to source voltage of M1 (i.e., $V_{DS,M1}$) should, theoretically, be equal to the drain to source voltage of M2 (i.e, $V_{DS,M2}$). However, in the traditional switched capacitor CMFB portion 10, the drain to source voltage of M1 is equal to the gate to source voltage of M1 (i.e., $V_{DS,M1}=V_{GS,M1}$) and the drain to source voltage of M2 is equal to the input common mode voltage ($V_{ICM}$) of the differential input signal minus the gate to source voltage of differential pair M3/M4 (i.e., $V_{DS,M2}=V_{ICM}-V_{GS,M3/M4}$). If $V_{DS,M1}$ does not equal $V_{DS,M2}$, a systematic error in current mirroring due to channel length modulation is to be expected, which can cause the output common mode voltage during the hold period ($V_{OCM\ hold}$) to deviate significantly from to move significantly from $V_{OCM\ hold}$. It is noted that $V_{OCM,\ hold}$ is equal to $(V_{OUT+}+V_{OUT-})/2$. To reduce channel length modulation, it is known to cascode both M1 and M2. However, to accommodate high output voltage swing (e.g., a swing of about 1.5 V where $V_{DD}$ equals 3.0 V), the M1/M2 current mirror is not cascoded. It is also known to increase the lengths of M1 and M2 to decrease channel modulation effect. However, increases in length are limited due to a corresponding increase in the gate capacitance of M2 which, if too great relative to the capacitances of $C_{CMFB+}$ and $C_{CMFB-}$, can reduce the common mode feedback loop gain.

FIG. 2 illustrates another switched capacitor CMFB circuit portion 20 for a telescopic operation amplifier using a more elaborate current mirroring technique to accommodate high voltage swings. For a detailed discussion of the input stage 20, attention is directed to Gulati, Kush and Lee, Hae-Seung, *A High-Swing CMOS Telescopic Operational Amplifier*, IEEE Journal of Solid-State Circuits, Vol. 33, No. 12, pp.2010–2019, December 1998.

Briefly, the current mirroring technique of the switched capacitor CMFB portion 20 uses a technique referred to as replica loop feedback. More specifically, the replica loop feedback replicates the differential pair M3/M4 for M1 as differential pair M5/M6. In addition, a negative feedback circuit using an operational amplifier 22 and a compensating capacitor (not shown) is provided to force the drain voltage of M5/M6 to be equal to the bias voltage. The compensating capacitor for the operational amplifier 22 has a capacitance approximately equal to the gate capacitance of M1. Although the current mirroring for the switched capacitor CMFB portion 20 does provide good minimization of current mirror error, it suffers from the disadvantage that extra circuitry to implement the operational amplifier 22 is required.

SUMMARY OF THE INVENTION

The present invention provides a fully differential telescopic operational amplifier having a switch capacitor common mode feedback (CMFB) circuit portion. The switched capacitor CMFB circuit portion has a current mirror for mirroring current from a first transistor to a second transistor. The first and second transistors have gates which are coupled via a transmission gate switch. Drains of each of the first and second transistors are respectively coupled to a first and a second differential pair of transistors, each differential pair connected to receive a common mode voltage and drains of the first differential pair connected to the gate of the first transistor. The first and second differential pair are scaled with respect to each other such that the gate to source voltage of the first transistor is substantially equal to the gate to source voltage of the second transistor.

BRIEF DESCRIPTION OF DRAWINGS

These and further features of the present invention will be apparent with reference to the following description and drawings, wherein:

FIG. 4b is a circuit diagram of a sample and hold stage of the pipeline analog to digital converter of FIG. 4a;

FIG. 4c is a circuit diagram of a residue amplifier stage of the pipeline analog to digital converter of FIG. 4a.

DISCLOSURE OF INVENTION

Figure 1:
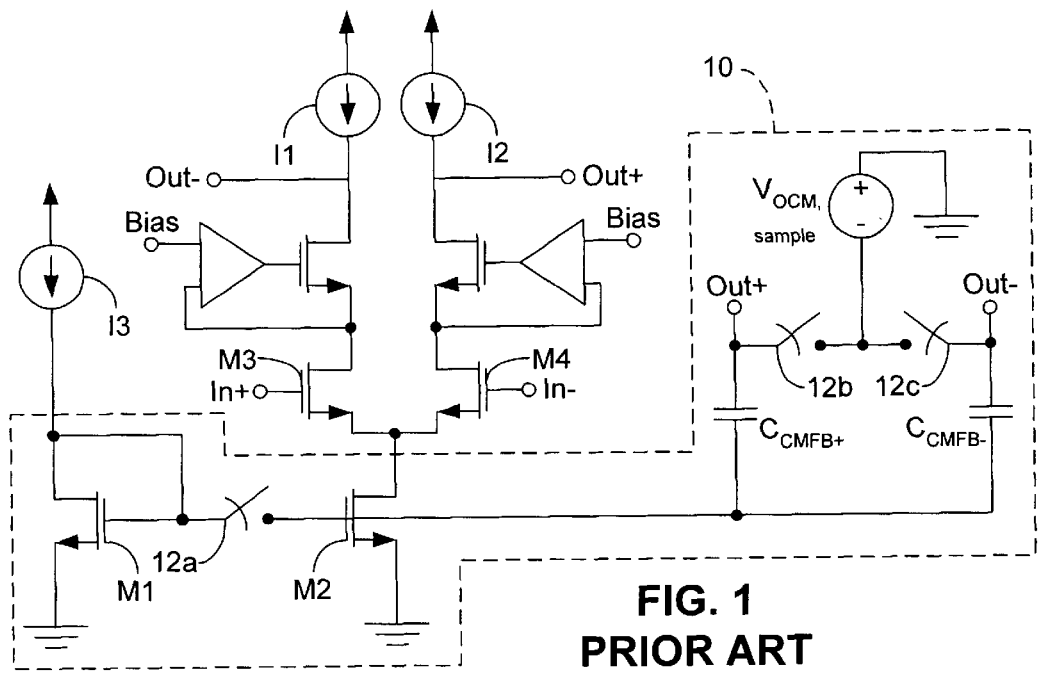
FIG. 1 is a circuit diagram of a conventional differential telescopic operational amplifier having a switched capacitor common mode feedback circuit portion.
Figure 2:
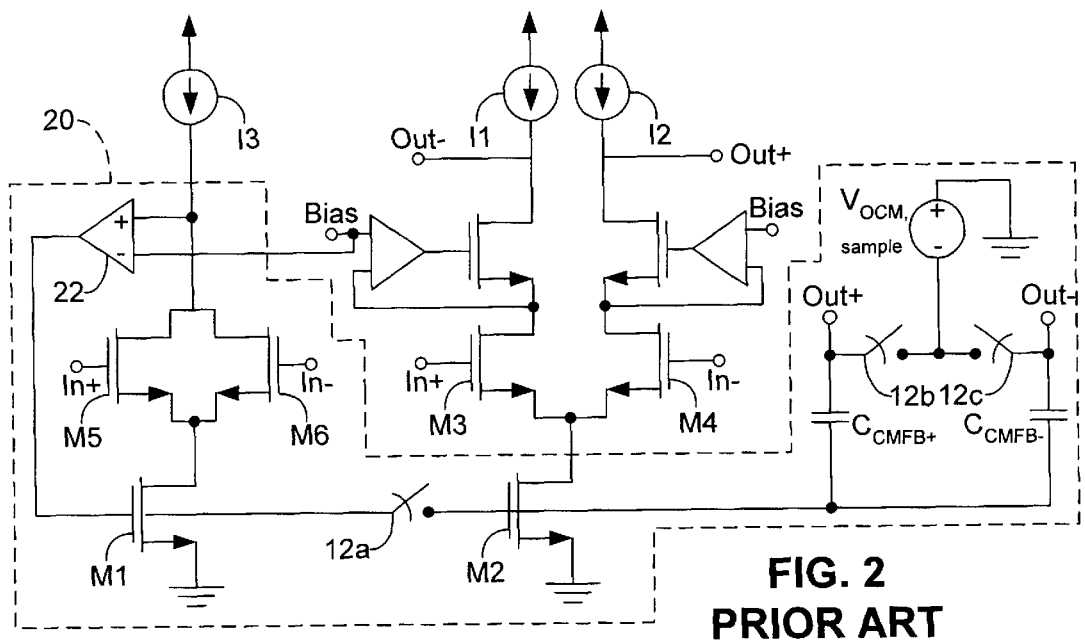
FIG. 2 is a circuit diagram of another conventional differential telescopic operational amplifier having a switched capacitor common mode feedback circuit portion.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Figure 3:
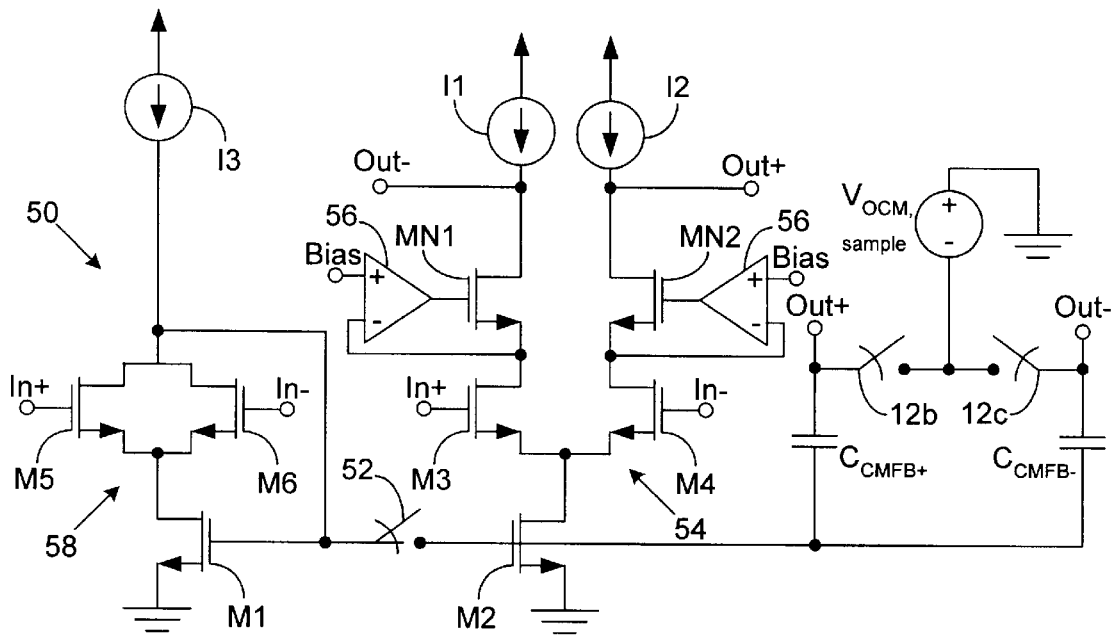
FIG. 3 is a circuit diagram of a differential telescopic operational amplifier having switched capacitor common mode feedback circuit portion according to the present invention.

Referring to FIG. 3, a circuit diagram of a fully differential telescopic operational amplifier having a switched capacitor common mode feedback (CMFB) circuit portion 50 is illustrated. The switched capacitor CMFB portion 50 has a current mirror that mirrors current from a first MOSFET, or M1, to a second MOSFET, or M2, via a transmission gate switch 52 such that bias current I3 is approximately equal to the sum of bias currents I1 and I2. The switch 52 is implemented with CMOS transmission gates enabled by a non-overlapping clock signal. The clock signal can be used to define a sample period and a hold period of various stages of a pipeline analog to digital converter as discussed in more detail below. A differential operational amplifier input signal with a preset input common mode voltage ($V_{ICM}$) is connected to respective non-inverting (In+) and inverting (In−) input nodes of a differential pair 54 consisting of third and fourth MOSFETs, or M3 and M4. $V_{ICM}$ is measured as $(V_{IN+}+V_{IN-})/2$. The drain of M2 is coupled to the source of M3 and M4. The drains of M3 and M4 are coupled to differential output nodes Out− and Out+ via cascoding MOSFETs MN1 and MN2 as is known in the art. MN1 and MN2 are coupled to gain enhancement amplifiers 56, such as differential folded cascode operational amplifiers as is also known in the art. Bias currents I1 and I2 are generated in a conventional manner. If the operational amplifier is configured as part of a sample and hold amplifier, the output swing of the operational amplifier will be centered around a predetermined optimum operating point during the sample period, which is $V_{OCM,sample}$.

The differential pair 54 is replicated as a differential pair 58 consisting of fifth and sixth MOSFETs, or M5 and M6. The sources of M5 and M6 are connected to the drain of M1. The drains of M5 and M6 are connected to bias current I3 and to the gate of M1. Bias current I3 is generated in a conventional manner. It is noted that the sum of I1 and I2 is approximately equal to I3 when a mirror ratio of M1 and M2 is 1:1. The gates of M5 and M6 are respectively connected to differential input nodes In+ and In− of the telescopic operational amplifier, which are biased by a preset input common mode voltage, or $V_{ICM}$. The MOSFETs M1 through M6 used to implement the present invention can be n-channel depletion type MOSFETs. However, as one skilled in the art will appreciate, the concepts presented herein apply equally to p-channel depletion type MOSFETs.

As a result of the foregoing configuration, the drain to source voltage of M1 ($V_{DS,M1}$) is equal to $V_{ICM}$ minus the gate to source voltage of M5 and M6 ($V_{GS,M5/M6}$), or $V_{DS,M1}=V_{ICM}-V_{GS,M5/M6}$. Similarly, the drain to source voltage of M2 ($V^{DS,M2}$) is equal to the ICM minus the gate to source voltage of M3 and M4 ($V_{GS,M3/M4}$), or $V_{DS,M2}=V_{ICM}-V_{GS,M3/M4}$. Therefore, if M3, M4, M5 and M6 are scaled according to their bias currents, such that $V_{GS,M5/M6}$ is equal or approximately equal to $V_{GS,M3/M4}$, any difference between $V_{DS,M1}$ and $V_{DS,M2}$ will be minimized. Thus, current mirroring error due to channel length modulation will be reduced.

As mentioned, M5 and M6 should be scaled according to their bias currents. More specifically, the bias current through M2 will be I1 plus I2 and the bias current through M1 will be I3. Since I3 is generally twice as big as either of I1 or I2 (when using a current mirror ratio of 1:1) and I3 is shared among M5 and M6; M3 and M4 should be of equal size to M5 and M6. It is noted that if a current mirror ratio other than 1:1 is employed, M3/M4 and M5/M6 should be sized appropriately.

The differential pair 58, and more particularly MOSFETs M5 and M6, should remain in saturation for all operating parameter ranges of the circuit (i.e., corner cases), including variations introduced as a result of the fabrication process, temperature fluctuations and power supply variations. To help keep M5 and M6 in saturation, M1 and M2 are sized such that the gate to source voltage of M1 (i.e., $V_{GS,M1}$) give M5 and M6 greater margin to operate in saturation.

As will be discussed in greater detail below, the operational amplifier of the present invention is well suited for use in a sample and hold stage and residue amplifier stages of a high resolution pipelined analog to digital converter. As is known, these stages have a sample mode during a sample period and a hold mode during a hold period. The impact of reducing current mirror error on the sample and hold operations of these stages is important and is explained as follows. During the sample mode, CMFB capacitors $C_{CMFB+}$ and $C_{CMFB-}$ are charged to a voltage equal to an output common mode voltage during the sample period ($V_{OCM,\,sample}$) minus $V_{GS,M1}$, where $V_{GS,M1}$ is based on the bias current I3. Ideally, during the hold period, $I_{D,M2}$ equals I3 which equals the sum of I1 and I2. However, if current mirror error ($I_{error}$) is present, I3 plus $I_{error}$ will not equal I1 plus I2. During the hold period, the voltage across CMFB capacitors $C_{CMFB+}$ and $C_{CMFB-}$ will be a voltage equal to an output common mode voltage during the hold period ($V_{OCM,\,hold}$) minus $V_{GS,M2}$. In the illustrated operational amplifier $V_{GS,M2}$ will move during the hold period to cancel $I_{error}$ such that $I_{D,M2}$ will equal, or approximately equal, I1 plus I2. Since the voltage $V_{OCM,\,hold}$ minus $V_{GS,M2}$ is a relatively fixed voltage during the hold period and its value is established during the sample period to be $V_{OCM,\,sample}$ minus $V_{GS,M1}$, $V_{OCM,\,hold}$ will adjust accordingly. It is advantageous that $V_{OCM,\,hold}$ does not excessively adjust, or move. Although the switched capacitor CMFB portion 50 reduces $V_{OCM,\,hold}$ variation, reducing the current mirror error further ensures that $V_{OCM,\,hold}$ variation is non-excessive and allows the operational amplifier output to be biased at a preferred point, which is approximately $V_{OCM,\,sample}$. As a result, headroom constraints and high gain/high output swing requirements can be accommodated. Should the operational amplifier output common mode voltage deviate too greatly from its preferred $V_{OCM,\,sample}$, MN1, MN2, I1 or I2 could potentially enter a non-saturation region during a high output swing and AC gain could be lost. AC gain loss also results in a loss of accuracy of a sample and hold amplifier or a residue amplifier configured with the operational amplifier as discussed in more detail below.

Figure 4A:
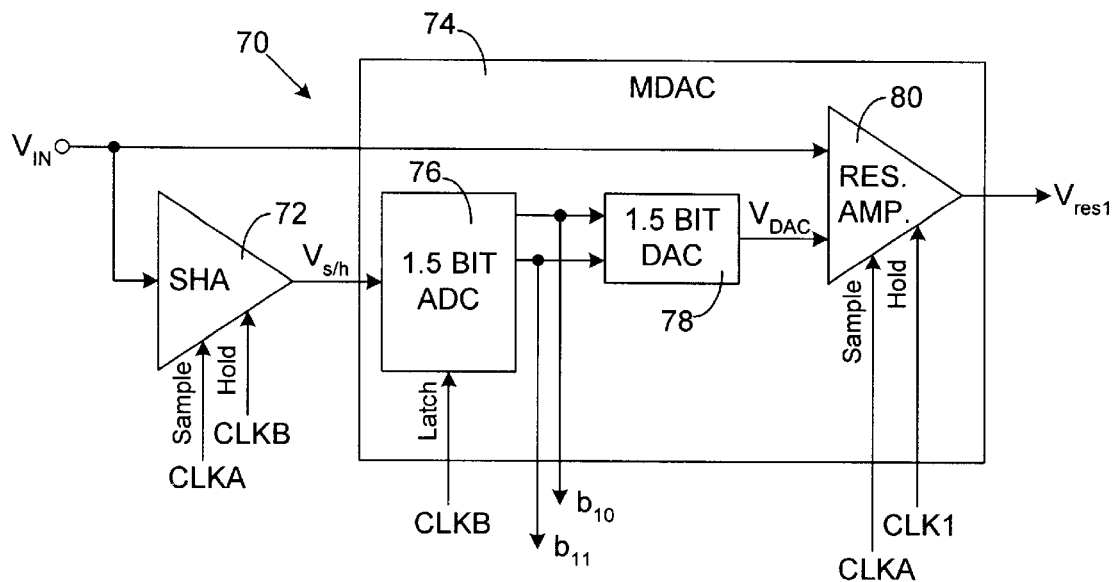
FIG. 4a is a block diagram of a portion of a pipeline analog to digital converter in which the differential telescopic operational amplifier of the present invention is suited for use.

Turning now to FIG. 4a, two initial stages of a pipelined analog to digital (A/D) converter 70, each taking advantage of the operational amplifier according to the present invention and having the switched capacitor CMFB portion 50, are illustrated. It should be understood that the illustrated A/D converter 70 is an example environment which can benefit from the operational amplifier of the present invention. It is also noted that the illustrated A/D converter 70 is not a complete illustration. For additional discussion of the A/D converter 70, attention is directed to co-owned U.S. patent application Ser. Nos. 09/506,037, 09/506,208, 09/506,284 and 09/506,316 each filed Feb. 17, 2000 and incorporated herein by reference in their entireties.

Figure 4B:
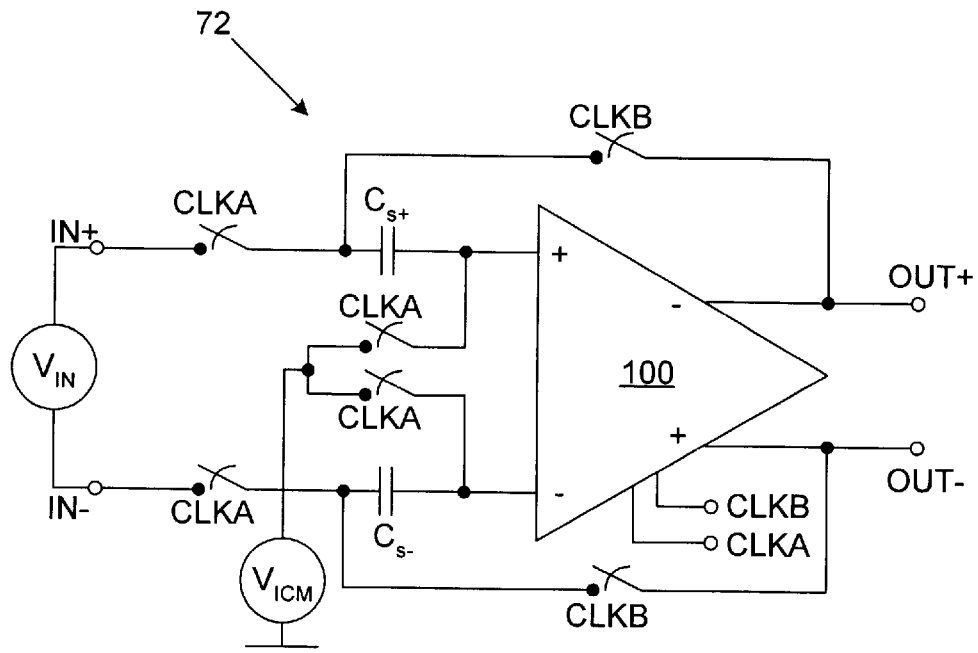
Figure 4C:
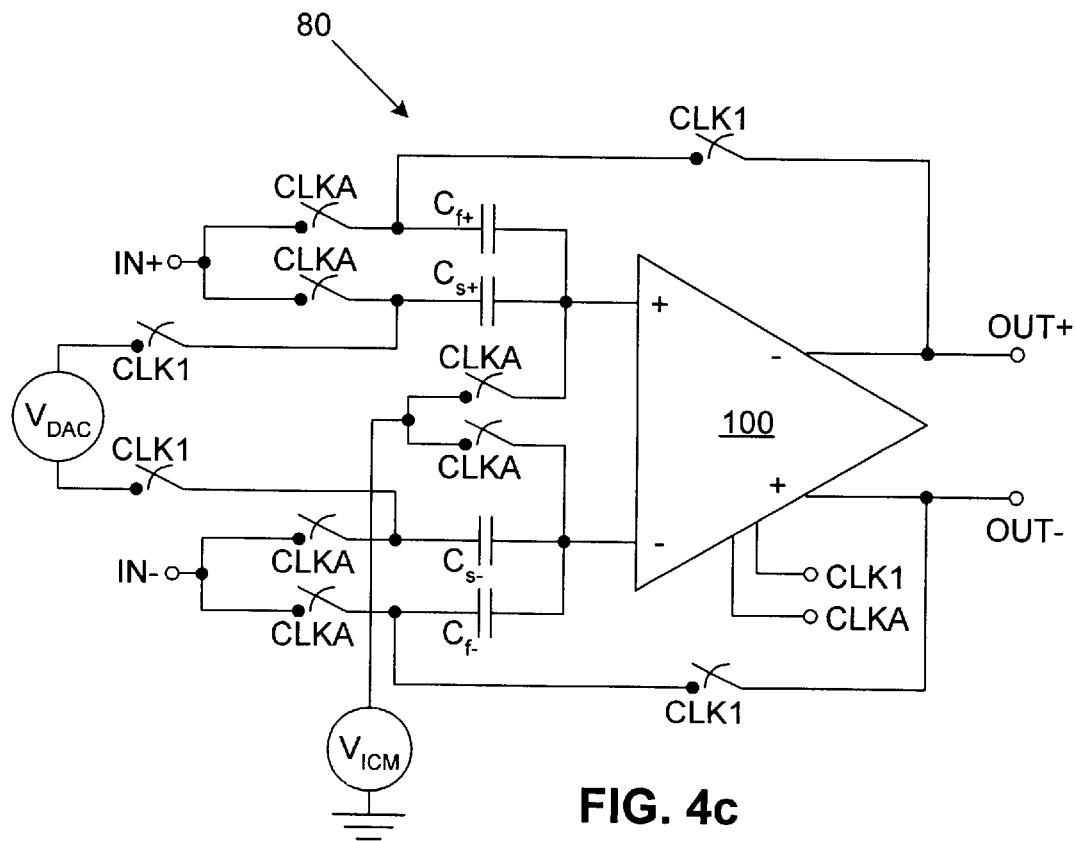

The first stage of the A/D converter 70 is a sample and hold amplifier (SHA) 72, which is further illustrated in FIG. 4b. An input of the SHA 72 samples a differential input signal, or $V_{IN}$, during a first clock pulse cycle, or CLKA. The SHA 72 holds a differential output signal, or $V_{s/h}$, at Out+ and Out− (FIG. 4b) during a second clock pulse cycle, or CLKB. The second stage of the A/D converter 70 is a multiplying digital to analog converter (MDAC) 74. The MDAC 74 converts and latches $V_{s/h}$ into a two bit binary word with a 1.5 bit analog to digital converter (ADC) 76. The two bit binary word, denoted as $b_{10}$ and $b_{11}$, is output from the MDAC 74 to be combined with the binary output from subsequent stages of the A/D converter 70 to produce a digital representation of $V_{IN}$. The two bit binary word is also converted in an analog signal, or $V_{DAC}$, by a 1.5 bit digital to analog converter (DAC) 78 for use in constructing a residue voltage signal, or $V_{res1}$. $V_{DAC}$ and $V_{IN}$ are sampled by a residue amplifier 80 during CLKA. $V_{res1}$ is held by the residue amplifier 80 (further illustrated in FIG. 4c) during a third clock cycle, or CLK1. $V_{res1}$ is sampled by the next stage in the pipeline A/D converter to continue the analog to digital conversion of $V_{IN}$ as explained in greater detail in the above-mentioned U.S. patent applications.

The SHA 72 and residue amplifier 80 are each implemented with a switched capacitor circuit having a fully differential operational amplifier 100 (described in more detail below with respect to FIGS. 5a and 5b). The operational amplifier 100 of both the SHA 72 and residue amplifier 80 are implemented using the switched capacitor CMFB portion 50 illustrated in FIGS. 3, 5a and 5b.

Figure 5A:
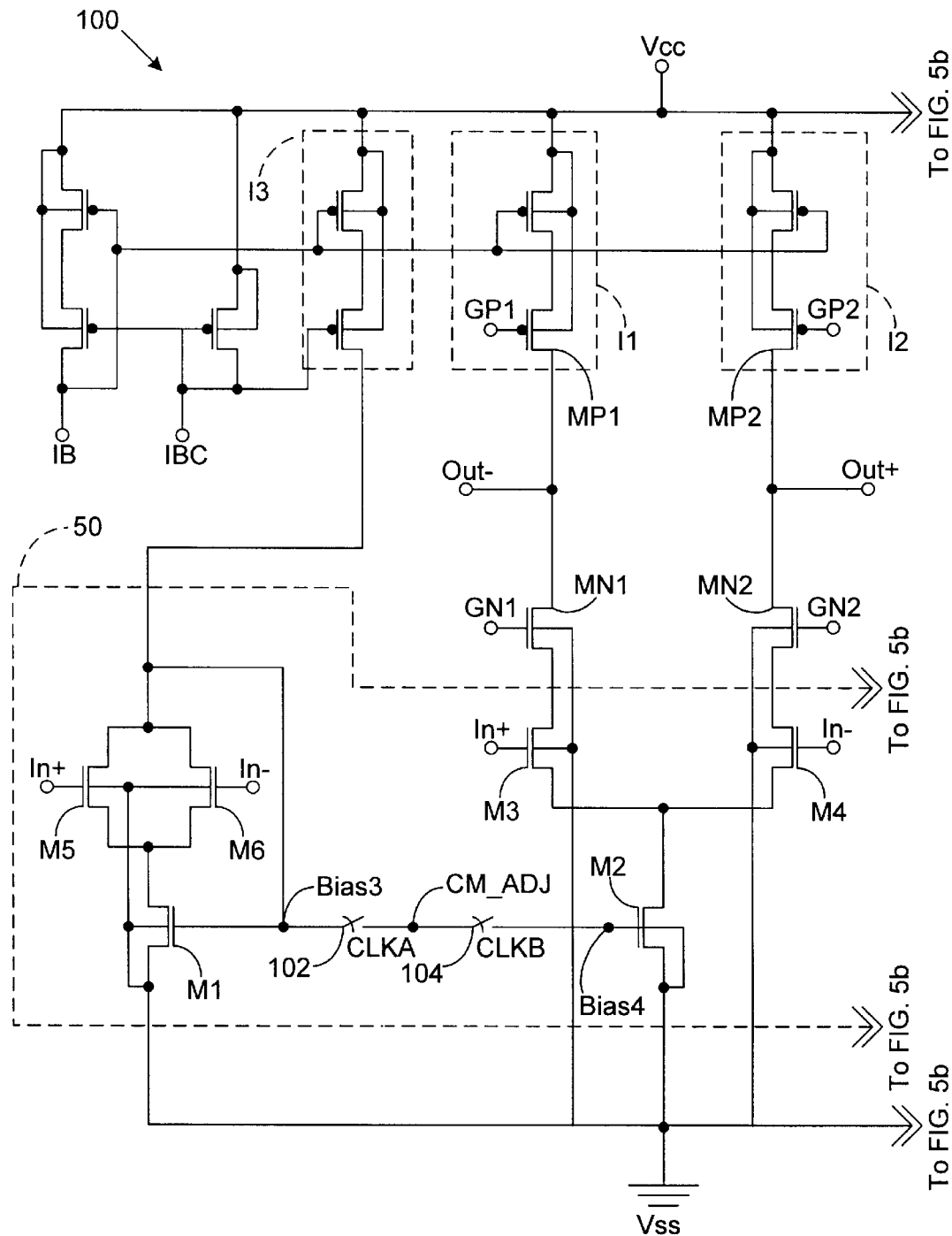
FIGS. 5a and 5b together are a block diagram of a differential operational amplifier according to another aspect of the present invention.
Figure 5B:
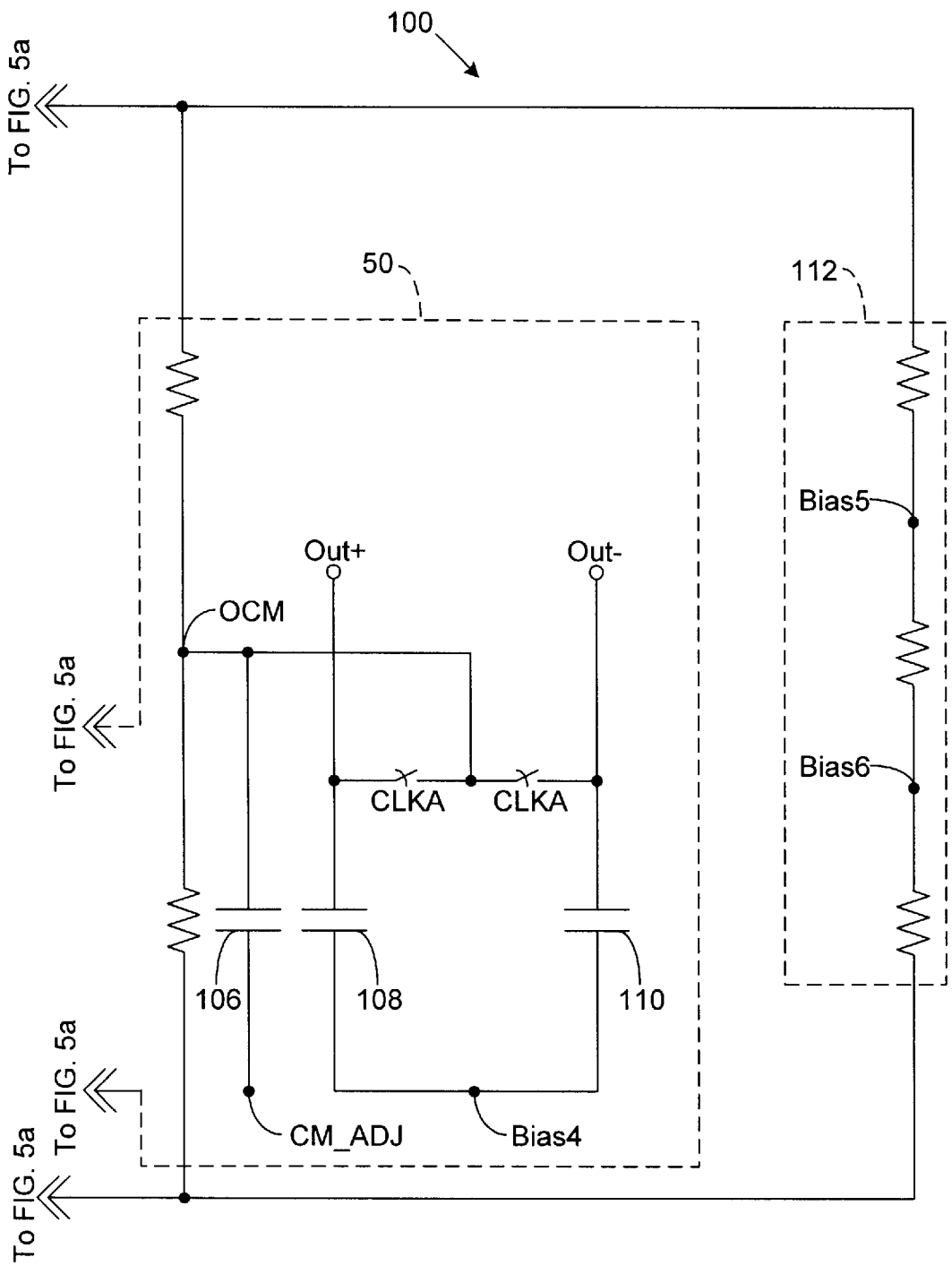

Referring now to FIGS. 5a and 5b, a fully differential telescopic operational amplifier 100 having the switched capacitor CMFB portion 50 according to the present invention is illustrated. For clarity, conventional support circuitry for the operational amplifier 100 is not illustrated. For instance, the structure of the gain enhancement amplifiers having outputs connected to nodes GN1, GN2, GP1 and GP2 are not illustrated.

Referring to FIG. 5a, the segment of the switched capacitor CMFB portion 50 including the MOSFETs M1 through M6 is illustrated along with bias current sources I1 through I3. The gates of M1 and M2 are connected using a pair of transmission gate switches controlled respectively by CLKA and CLKB, also denoted as switch 102 and switch 104. Node bias3 is connected at the gate of M1. Node common mode adjust, or CM_ADJ, as well as capacitor 106 (FIG. 5b), are connected between switches 102 and 104. Node bias4, as well as capacitors 108 and 110 (FIG. 5b), are connected at the gate of M2. In general, switches 102 and 104, along with charge storing capacitors 106, 108 and 110, are used to transfer the charge at node bias3 to node bias4.

It is noted that when the operational amplifier 100 is connected to act as the SHA 72 (FIG. 4b), $V_{IN}$ is the differential input signal connected across the sampling capacitors $C_{s+}$ and $C_{s−}$. $C_{s+}$ and $C_{s−}$ are also connected to the inputs of the operational amplifier 100 along with $V_{ICM}$. As the pulse of CLKA goes high, the SHA 72 will sample $V_{IN}$ and the operational amplifier 100 will set its output voltage to $V_{OCM, sample}$. More specifically, switch 102 will close and the voltage present at node bias3 will be applied to node CM_ADJ. With additional reference to FIG. 5b, the node CM-ADJ is connected to capacitor 106. Capacitor 106 is also connected to node output common mode, or node OCM, which sets the optimum output operating point, or $V_{OCM\ sample}$, which is usually between Vcc and Vss so that MOSFETs MP1 and MP2 remain in saturation on upward output voltage swings and so that MOSFETs MN1 and MN2 remain in saturation on downward output voltage swings. Therefore, when switch 102 closes, capacitor 106 is charged with the voltage at bias3 relative to $V_{OCM, sample}$. As CLKA goes low, switch 102 opens. Thereafter CLKB goes high to close switch 104 and the switch capacitor CMFB portion 50 will hold the output common mode voltage close to its optimum value, i.e., $V_{OCM, hold}$ will be approximately equal to $V_{OCM, sample}$. As switch 104 closes the charge present at CM_ADJ is transferred to node bias4. Capacitors 108 and 110, along with capacitor 106, complete the switched capacitor common mode feedback (CMFB) circuit portion 50. The voltages generated at nodes bias5 and bias6 by voltage divider 112 are applied to the gain-enhancement amplifiers (not illustrated), whose outputs are coupled to nodes GP1, GP2, GN1 and GN2. It is noted that when the operational amplifier 100 is connected to act as the residue amplifier 80 (FIG. 4c), the basic operation is the same as in the SHA 72 but the sample mode is enabled by CLKA and the hold mode is enabled by CLK1.

As discussed above, the systematic current mirroring error due to channel length modulation between M1 and M2 is reduced since the drain to source voltage of both M1 and M2 are very similar. As a result, the voltage at bias3 will be substantially equal to the voltage at bias4, thereby reducing ripple at bias4 during the clock phases of CLKA and CLKB. As a result, the output common mode voltage during a hold mode is more likely to remain within its optimum operating point which is predetermined during a sample mode.

Although particular embodiments of the invention have been described in detail, it is understood that the invention is not limited correspondingly in scope, but includes all changes, modifications and equivalents coming within the spirit and terms of the claims appended hereto.

What is claimed is:

1. A fully differential operational amplifier comprising a switched capacitor common mode feedback (CMFB) circuit portion, the switched capacitor CMFB circuit portion has a current mirror for mirroring current from a first transistor to a second transistor, gates of the first and second transistors coupled via a transmission gate switch and drains of each of the first and second transistors respectively coupled to a first and a second differential pair of transistors, each differential pair connected to receive a common mode voltage and drains of the first differential pair connected to the gate of the first transistor, and the first and second differential pair being scaled with respect to each other such that the gate to source voltage of the first transistor is substantially equal to the gate to source voltage of the second transistor.

2. The operational amplifier according to claim 1, wherein the operational amplifier is connected as part of a sample and hold amplifier stage of a pipelined analog to digital converter which samples an input signal during a first clock signal and holds the sampled input signal during a second clock signal, and the transmission gate switch is coupled to the first clock signal to set output voltages to an optimum operating point and is coupled to the second clock signal during which the operational amplifier holds the sampled input signal centered around the optimum operating point.

3. The operational amplifier according to claim 1, wherein the transistors are n-channel depletion type MOSFETs.

4. The operational amplifier according to claim 1, wherein the second differential pair has a first bias current coupled to the drain of one of the transistors of the second differential pair and a second bias current coupled to the drain of the other of the transistors of the second differential pair, and the first differential pair has a third bias current coupled to the drains of the transistors of the first differential pair, and wherein a sum of the first and second bias currents is approximately equal to the third bias current.

5. The operational amplifier according to claim 1, wherein the transistors of the first differential pair are scaled to be equal the size of the transistors of the second differential pair.

6. The operational amplifier according to claim 1, wherein the transistors of the first differential pair are kept in saturation for all operating parameters of the operational amplifier.

* * * * *